March 16, 1954 W. SHOCKLEY 2,672,528

SEMICONDUCTOR TRANSLATING DEVICE

Filed May 28, 1949 2 Sheets-Sheet 1

INVENTOR
W. SHOCKLEY
BY [signature]
ATTORNEY

March 16, 1954 W. SHOCKLEY 2,672,528

SEMICONDUCTOR TRANSLATING DEVICE

Filed May 28, 1949 2 Sheets-Sheet 2

INVENTOR
W. SHOCKLEY
BY
[signature]
ATTORNEY

Patented Mar. 16, 1954 2,672,528

UNITED STATES PATENT OFFICE 2,672,528

SEMICONDUCTOR TRANSLATING DEVICE

William Shockley, Madison, N. J., assignor to Bell Telephone Laboratories, Incorporated, New York, N. Y., a corporation of New York Application May 28, 1949, Serial No. 96,059

11 Claims. (Cl. 179—171)

This invention relates to semiconductor signal translating devices and more particularly to such devices of the general type disclosed in the applications, Serial No. 35,423, filed June 26, 1948 and Serial No. 89,969, filed April 27, 1949 of W. Shockley.

Translating devices of the type disclosed in the applications above identified, which are of the class of devices which has come to be known as transistors, comprise a body of semiconductive material, a pair of spaced connections to the body, and a third large area or ohmic connection to the body at a region spaced from the first-mentioned connections. The two spaced connections are designated as the emitter and collector and the large area or ohmic connection is termed the base. Amplified replicas of input signals impressed between the emitter and base are obtained in a load circuit connected between the collector and base.

A structural feature of such devices is that the collector connection, or both the emitter and collector connections, is defined by a zone in the semiconductive body of conductivity type opposite that of the body. For example, the body may be of N conductivity type germanium and the collector may be constituted by a surface zone of P-type germanium in the body. This zone may be produced, in one way, by nuclear bombardment of a restricted area of one face of the N-type body, as disclosed in the application, Serial No. 89,969 referred to hereinabove, to effect transformation of a surface region of the body to P conductivity type.

In the operation of such devices, a substantial direct current bias obtains between P and N regions at the collector. The transition region or junction between the collector and body is of small thickness, for example of the order of $10^{-4}$ centimeter in an illustrative device, so that at a surface area of the body intersected by this region a very strong field exists. Consequently, current leakage may occur across this region or junction at the surface of the body. Such leakage is a source of random, spurious variations or noise in the output of the device.

One object of this invention is to reduce such variations, thereby to increase the signal to noise ratio for the translating device and, hence, to enhance its performance.

In accordance with one general and broad feature of this invention, leakage currents at the intersection of a P-N junction or transition region and the surface of the semiconductive body are inhibited by controlling the fields in the vicinity of this intersection.

Such control may be effected in one way, in accordance with a specific feature of this invention, by tapering the zone defining the collector toward the intersection, thereby to reduce the gradient across the transition region at the surface.

The control may be effected also, in accordance with another specific feature of this invention, through the agency of an auxiliary or guard electrode upon the collector zone and in proximity to the intersection region aforenoted, this electrode being operated at ground potential for alternating current signals. The bias of this electrode may be the same as that of the collector; however, for some structures it may be biased at a small voltage relative to the base, for example of the order of that on the emitter.

The invention and the above-noted and other features thereof will be understood more clearly and fully from the following detailed description with reference to the accompanying drawing in which.

Illustrative of the semiconductor materials which may be utilized in devices constructed in accordance with this invention is N conductivity type germanium produced as disclosed in the application, Serial No. 638,351, filed December 29, 1945 of J. H. Scaff and H. C. Theuerer.

Figure 1:
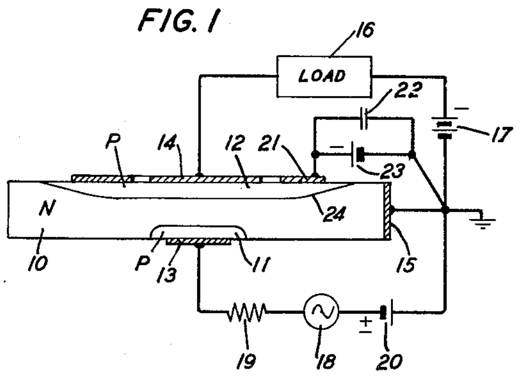
Fig. 1 shows diagrammatically a semiconductor signal translating device illustrative of one embodiment of this invention.

Referring now to the drawing, the signal translating device illustrated in Fig. 1 comprises a thin disk or wafer 10, for example of high back voltage N conductivity type germanium, having in opposite surfaces thereof zones or regions 11 and 12 of P conductivity type material, which advantageously are coaxial. Ohmic connections 13 and 14, for example platings of rhodium, are made to the zones or regions 11 and 12 respectively and serve as the emitter and collector connections respectively. A third ohmic connection 15, which also may be for example a coating of rhodium, is applied to the peripheral part of the N-type body 10 and serves as the base connection.

In a typical device, the body 10 may be a disk of the order of 0.20 centimeter in diameter and 0.01 centimeter thick and the emitter and collector zones 11 and 12 respectively may be circular and of the order of 0.002 centimeter thick. These zones 11 and 12 may be produced by nuclear bombardment of the opposite faces of the N-type body 10 in the manners disclosed in the application, Serial No. 89,969, referred to hereinabove.

In the operation of the device, the base 15 is grounded, as shown, and the output circuit including the load 16 and a biasing source 17 is connected between the base and the collector connection 14. The collector is biased in the reverse direction relative to the body 10, that is, at a negative potential which may be of the order of 10 to 100 volts, by the source 17. The input circuit comprising the alternating current signal source 18, a resistor 19 and a biasing source 20 is connected between the base and the emitter connection 13, as shown. The bias applied by the source 20 may be of the order of 1 volt and usually is positive although in some applications it may be negative. Amplified replicas of signals applied between the emitter 13 and base 15 by the source 18 appear across the load 16.

The transition region 24 between the P-type collector zone 12 and the body 10 intersects the surface in which the P-type zone 12 appears. Because of the potential difference between the collector 12 and the body 10 leakage currents may flow across the intersection of this transition region 24 with the surface noted. Such leakage currents give rise to random variations or noise in the output or load circuit. In order to reduce the fields and, hence, the leakage currents across the intersection, the P-type zone 12 is tapered near its margin, as illustrated in Fig. 1.

Figure 2:
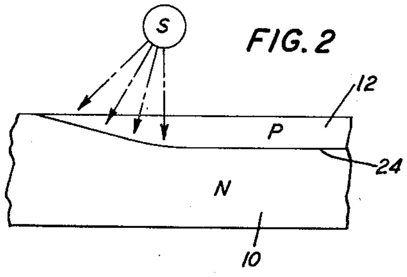
Fig. 2 illustrates one way in which the tapered collector zone in the device of Fig. 1 may be formed.
Figure 3:
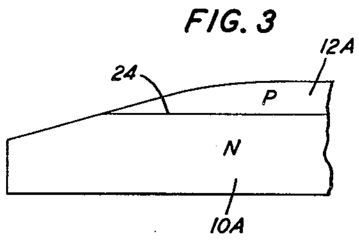
Fig. 3 illustrates another manner in which a tapered zone of one conductivity type may be produced upon a body of the opposite conductivity type.

Such taper may be realized in one way as illustrated in Fig. 2 by controlling the direction and intensity of radiation of the nuclear particles emanating from the source S and directed against the body 10, to produce the marginal portion of the zone 12. A similar taper may be produced in another way illustrated in Fig. 3 by forming a surface layer 12A of uniform thickness upon the N-type body 10A and then grinding away the peripheral portion of the layer and the body.

In order to further reduce such currents in the output circuit, an auxiliary or guard electrode 21, which may be annular and coaxial with the collector connection 14 and in the form of a rhodium plating, is provided upon the P-type zone 12 in the vicinity of the intersection above noted. This guard electrode 21 is connected to the base by way of a condenser 22 and, therefore, is at alternating current ground potential, and may be biased at a potential intermediate that of the collector and the base, for example, of the order of −5 volts. The desired alternating current signals in the load circuit will be developed at the collector connection 14 inasmuch as the collector is connected to the guard ring not directly but only through the thin layer of P-type material between the collector connection 14 and the guard ring 21. Advantageously, in order to reduce the resistive load on the collector, the thickness of the P-type region between the collector and the guard electrode is made small and this material is made of only weak P-type. The guard electrode 21 serves in the nature of a suppressor to prevent noise due to leakage across the intersection of the transition region 24 with the surface.

Figure 4:
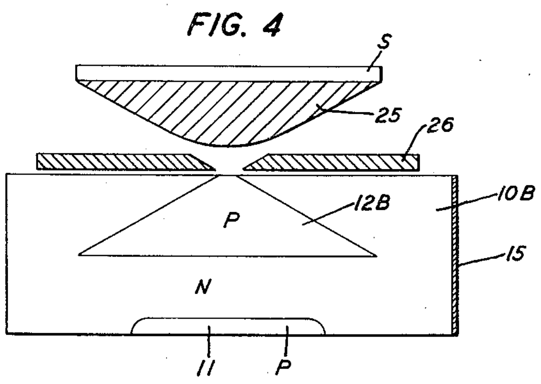
Fig. 4 illustrates still another way in which such a tapered zone may be produced.

The tapered form of P-type region together with a small area intersection between the transition region and the surface of the body 10 may be produced also in the manner illustrated in Fig. 4. As shown in this figure, nuclear particles emanating from the source S are controlled in intensity and direction by a filter 25 and projected against the body 10B through a slit or aperture in a mask 26 adjacent the surface of the body 10 and impenetrable to the nuclear particles. The source S may be a a naturally radio active one producing alpha particles, for example polonium, plutonium or radium. Because of the direction of the alpha particles a conical wedge-shaped zone of P-type material 12B is formed in the N-type body 10B. A similar form of zone 12B can be produced when the conversion of N to P-type is effected by nuclear particles projected by a suitable accelerator, by varying the orientation of the body 10B with respect to the direction of incidence of the nuclear beam thereon.

Figure 5:
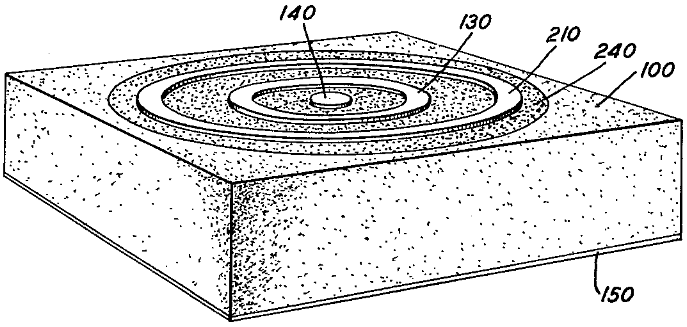
Fig. 5 is a perspective view of a semiconductor signal translating device illustrative of another embodiment of this invention.
Figure 6:
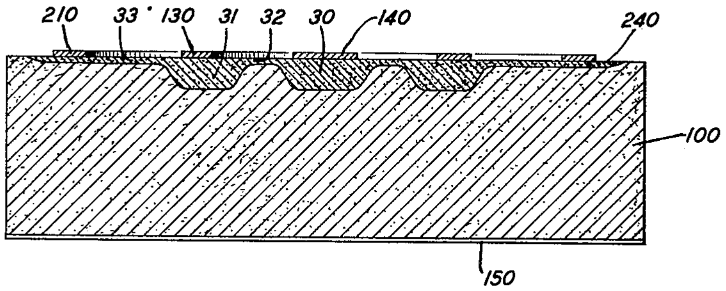
Fig. 6 is a sectional view of the device of Fig. 5, showing the configuration of the converted zones in one face of the semiconductor body.

In the embodiment of this invention illustrated in Figs. 5 and 6, the N-type wafer 100, for example of high back voltage N conductivity type germanium, has in one face thereof a layer of P conductivity type, this layer comprising a central, circular relatively thick portion 30, an annular relatively thick portion 31 concentric with the central portion 30 and a thin annular web 32 extending between the central and annular portions 30 and 31. The layer comprises also an outer marginal portion 33 extending from the annular part 31. The several portions of the layer may be produced by converting the N-type body material to P-type material by nuclear bombardment, the various thicknesses being produced by controlling individually or jointly the nature, energy or direction of the bombarding particles. For example, this layer may be produced by first converting a thin surface layer of the wafer 100 to P-type by bombardment with alpha particles and then bombarding the regions corresponding to the portions 30 and 31 with deuterons. Alternatively, the several regions or portions may be produced by bombarding the surface with nuclear particles of one kind and controlling the energy or direction of the particles to effect deeper conversion of N to P-type material at the regions 30 and 31.

In an illustrative device, the diameter of the collector 140 and the width of the emitter 130 and auxiliary or guard electrode 210 may be 0.005 centimeter, the guard electrode may be spaced 0.025 centimeter, edge to edge, from the collector and the emitter and collector may be spaced 0.014 centimeter, the width of the zone 32 being 0.01 centimeter. The zones 32 and 33 may be 0.0004 centimeter thick and the zones 30 and 31 may be 0.002 centimeter thick. The periphery of the electrode 210 may be spaced 0.01 centimeter from the intersection of the junction 240 with the surface of the block or body 100.

Ohmic collector and emitter connections 140 and 130 respectively, which may be rhodium platings, are made to the thicker zones 30 and 31. A similar ohmic base connection 150 is made to the opposite surface of the body 100. An annular auxiliary or guard electrode connection 210 is provided to the marginal portion 33 inside of and in the vicinity of the intersection between the transition region 240 and the surface of the body 100 having the P-type layer therein.

In the operation of the device, the collector 140 is biased negative, for example of the order of 10 to 15 volts, with respect to the base 150. The emitter connection 130 is biased at a small potential, for example of the order of 1 volt negative, with respect to the base 150 and the auxiliary or guard electrode also is biased slightly negative, also of the order of 1 volt, with respect to the base. As a result of signals impressed upon the emitter, the resistance of the thin web 32 is modulated whereby variations in the collector current corresponding to the signals impressed upon the emitter are produced. Advantageously, in order that highly effective modulation may be realized, the web 32 should be very thin, for example of the order of $4 \times 10^{-4}$ centimeters and form with the N-type body 100 an abrupt junction with a high capacity across the transition layer or region.

The auxiliary or guard electrode, as in the device disclosed in Fig. 1 and described heretofore, serves to suppress noise due to leakage currents flowing across the intersection between the transition region 240 and the surface of the body or wafer 100.

Figure 7:
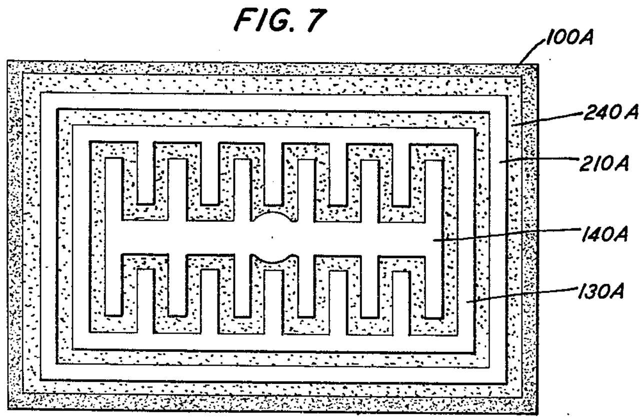
Fig. 7 is a plan view of a translating device illustrative of another embodiment of this invention.

The device illustrated in Fig. 7 is a modification of that illustrated in Figs. 5 and 6 and described hereinabove. The collector connection 140A is provided with a plurality of parallel and oppositely extending projections or teeth which are in interleaved relation with similar teeth on the emitter connection 130A. The auxiliary or guard electrode 210A encompasses the emitter connection and is disposed between it and the intersection of the transition region; 240A with the surface of the semiconductive N-type body 100A. It will be understood that, as in the device shown in Figs. 5 and 6, the P-type regions below the teeth and body of the emitter and collector connections are relatively thick and the P-type webs between each tooth of the collector and the adjacent teeth of the emitter are relatively thin similar to the web 32 in Fig. 6.

Although specific embodiments of this invention have been shown and described, it will be understood that they are but illustrative and various modifications may be made therein without departing from the scope and spirit of this invention.

What is claimed is:

1. A signal translating device comprising a body of semiconductive material of one conductivity type, having on one face thereof a zone of semiconductive material of the opposite conductivity type, base, emitter and collector connections to said body, said collector connection contacting said zone, and auxiliary electrode means encompassing said collector connection and contacting said zone adjacent the periphery thereof.

2. A signal translating device comprising a body of N-type semiconductive material having on one face thereof a zone of P-type material, a collector connection to said zone, emitter and base connections, one of which is to the opposite face of said body, a guard electrode upon said zone and encompassing said collector connection and adjacent the intersection of the junction between said zone and body and said one face, a first circuit connected between said emitter and base connections, a second circuit including means biasing said collector connection in the reverse direction relative to said body, and means biasing said guard electrode in said reverse direction and at a lower potential than the bias on said collection connection.

3. A signal translating device in accordance with claim 2 wherein the marginal portion of said zone decreases in thickness toward said intersection.

4. A signal translating device comprising a body of semiconductive material of one conductivity type having in one face thereof a zone of the opposite conductivity type, a collector connection to said zone, an emitter connection to the opposite face of said body, a base connection to said body, and an auxiliary electrode upon said zone adjacent the margin thereof.

5. A signal translating device comprising a body of germanium of one conductivity type and having in one face thereof a zone of the opposite conductivity type, an ohmic connection to said zone, a rectifying connection to said body opposite said zone, a base connection to said body, and a guard electrode upon said zone adjacent the margin thereof.

6. A signal translating device comprising a body of N-type germanium having in one face thereof a zone of P conductivity type, a collector connection to said zone, an emitter connection to said body opposite said zone, a base connection to said body, means biasing said collector connection negative with respect to said base connection, an auxiliary electrode upon said zone adjacent the periphery thereof and encompassing said collector connection, means biasing said auxiliary electrode negative with respect to said base and at a potential lower than the bias upon said collector connection, and a direct alternating current connection between said auxiliary electrode and said base connection.

7. A signal translating device comprising a body of N-type germanium having in opposite faces thereof zones of P conductivity type, one of said zones having its marginal portion tapering toward the respective face of said body, an output circuit including a collector connection to said one zone, an input circuit including an emitter connection to the other of said zones, a base connection to said body, and a guard electrode upon said one zone, adjacent the periphery thereof, encompassing said collector connection and grounded to said base connection for alterating current.

8. A signal translating device comprising a body of semiconductive material of one conductivity type having on one face thereof a layer of the opposite conductivity type, emitter and collector connections to spaced regions on said layer, a base connection to said body, and a guard electrode upon said layer, adjacent the periphery thereof and disposed about said emitter and collector connections.

9. A signal translating device comprising a body of semiconductive material of one conductivity type having in one face thereof a zone of the opposite conductivity type, a first ohmic connection to said zone, a second ohmic connection to said zone and encompassing said first connection, a third ohmic connection to said zone adjacent the periphery thereof and encompassing said second connection, and a fourth connection to said body remote from said zone.

10. A signal translating device comprising a body of semiconductive material of one conductivity type having on one face thereof a layer of the opposite conductivity type, said layer having two substantially concentric relatively thick regions connected by a relatively thin web, a pair of ohmic connections to said layer opposite said two regions, a third ohmic connection to said layer at an area extending about the outer of said two regions, and a fourth connection to said body at a region spaced from said layer.

11. A signal translating device comprising a body of N-type germanium having on one face thereof a layer of P conductivity type, said layer including a central relatively thick zone, an annular relatively thick zone encompassing and substantially concentric with said central zone and connected thereto by a thin web and an outer zone extending from said annular zone, concentric ohmic connections to said central, annular and outer zones, and an ohmic connection to the opposite face of said body.

WILLIAM SHOCKLEY.

References Cited in the file of this patent

UNITED STATES PATENTS

| Number | Name | Date |
| --- | --- | --- |
| 2,476,323 | Rack | July 19, 1949 |
| 2,486,776 | Barney | Nov. 1, 1949 |
| 2,524,035 | Bardeen et al. | Oct. 3, 1950 |